Aug. 17, 1965 A. J. BRADT ETAL 3,201,655

ELECTRONIC MODULES

Filed Sept. 1, 1961

INVENTORS
ALBERT J. BRADT
JOSEPH T. CURRY
ROBERT A. ESTOCK

BY Earl C. Hancock
AGENT

United States Patent Office 3,201,655
Patented Aug. 17, 1965

3,201,655

ELECTRONIC MODULES

Albert J. Bradt, Boulder, Joseph T. Curry, Littleton, and Robert A. Estock, Denver, Colo., assignors to Martin-Marietta Corporation, a corporation of Maryland Filed Sept. 1, 1961, Ser. No. 135,503
4 Claims. (Cl. 317—101)

Figure 1:
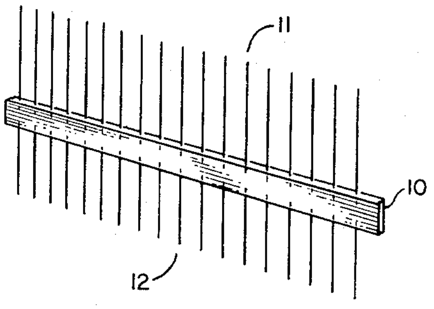

This invention relates to electronic modules. In particular, this invention relates to an apparatus for high density packaging of a large number of electronic components. More particularly, this invention relates to a method and apparatus for high density packaging of a large number of electronic components into an encapsulated electronic module having a small volume, high mechanical strength, light weight, excellent reliability and superior environmental compatibility.

Of recent, the electronics industry has placed increasing emphasis upon the packaging of electrical components in as small a space and with as little weight penalty as possible. The component miniaturization efforts as well as the development and expanded usage of the transistor have been material in making possible low volume, light weight and high density packaging of groups of electrical and electronic components generally referred to as modules.

However, the actual forms and processes used for arranging of the components within a module structure has proven to be a vexatious problem to the electronics industry. The forms that are used must be readily adaptable to accommodate any of a wide variety of possible arrangements during the engineering phase of the module. Thereafter the form must provide a structure that can be quickly, easily and conveniently assembled during the manufacturing phase. Finally, the module that is produced must operate with a high degree of reliability while being relatively isolated from its atmospheric environment.

Accordingly, the present invention provides an apparatus for packaging a large number of electrical components in a minimum amount of space with a high degree of reproducibility, adaptability and convenience. In particular, the present invention contemplates utilizing an elongated strip of insulating material having a plurality of generally parallel conductors or wires extending therefrom upon which a variety of electrical components can be mounted and interconnected. Thereafter the entire assembly can be encapsulated with selected conductors extending therefrom for interconnecting the module with other circuitry. The present invention is particularly useful for producing a relatively compact module when a number of small electrical components are to be interconnected with and arranged in proximity to a large electrical component or components. For instance, a multiplicity of small electrical components could be mounted on a plurality of parallel conductors which are in turn mounted on a pliable insulation strip. Then the strip could be formed around a large component such as a transformer, the leads of the larger component interconnected with the conductors, and the entire assembly encapsulated into module form. The encapsulation process isolates the components of the module from its atmospheric environment and also materially reduces the possibility of component or connection failure due to vibration.

Another arrangement in accordance with this invention comprises holding two conductor bearing insulation strips in parallel on either side of a relatively large electrical component or components. The smaller components can then be interconnected in a web arrangement between the two sets of conductors. Again the entire assembly can be encapsulated into module form.

Still another arrangement in accordance with the present invention which has been found to be highly advantageous is centered around utilizing a flat strip having an elongated insulating strip attached to each side thereof so as to define a channel. The insulating strips on each side of the channel each retain a plurality of substantially parallel wires or conductors in the same general plane as the retaining strip but perpendicular to the longitudinal axis thereof. The channel can be preformed from a single sheet of material or the insulating strips can be clamped or bonded to the flat strip or any of a number of configurations could be possible. Also the flat strip or base of the channel could be made of insulating material or it could be made of metallic material, the latter being especially useful for providing a heat sink if desired. Then the larger components can be physically mounted on either or both sides of the flat strip with the leads thereof being interconnected to the parallel wires. An electronic module can then be produced by interconnecting the smaller components to the parallel conductors and potting or encapsulating the entire assembly.

By use of the present invention not only are the aforementioned advantages realized but additionally the configurations employed are particularly conducive to resistance welding of the components.

Figure 2:
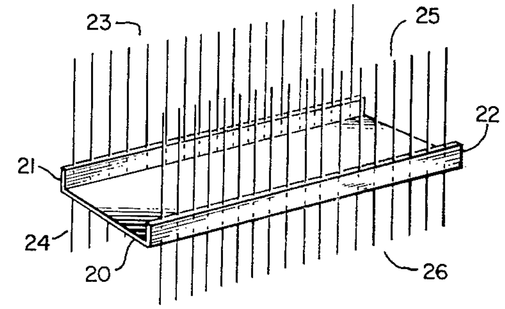
Figure 3:
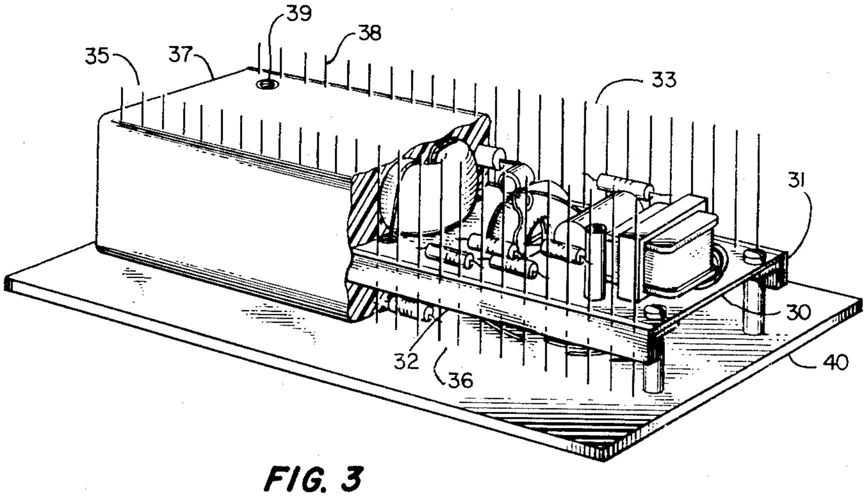

The novel features that are considered characteristic of this invention are set forth with particularity in the claims. The invention, however, both as to its organization and method of operation as well as additional features and advantages thereof will be best understood from the following description when read in connection with the accompanying drawing in which:

FIGURE 1 illustrates a typical basic conductor bearing strip in accordance with this invention, and FIGURE 2 shows a generally channel shaped arrangement particularly useful for more complex circuits in accordance with this invention, and FIGURE 3 exemplifies the appearance of a typical module constructed in accordance with this invention by showing a portion of the encapsulating material broken away.

FIGURE 1 shows a flat elongated strip 10 which is preferably fabricated from insulating material. Two sets of substantially parallel conductors shown generally at 11 and 12 are retained by strip 10. Conductor sets 11 and 12 could be made from single conductors passed completely through strip 10, of course. Strip 10 could be typically constructed of nylon and/or phenolic material with conductors 11 and 12 heated and forced into the nylon so as to be forcibly retained thereby. Thus conductors can be added or removed from strip 10 with facility. Another way of constructing the configuration of FIGURE 1 could be realized by retaining conductors 11 and 12 between a series of strips of insulating tape with enough of these strips being placed one on top of the other to create a strip similar to 10. Still another method of constructing the strip is to laminate a series of conductors in place between layers of glass cloth or the like pre-impregnated with polyester or epoxy resins which is then cured under heat and pressure within the confines of a mold. The configuration shown in FIGURE 1 may be occasionally referred to hereinafter as a fishbone or fishbone assembly.

A series of small electrical components (not shown) such as resistors, capacitors and the like can then be mounted between the various ones of conductors 11 and 12. The entire assembly can then be potted or encapsulated in insulating material thus producing a "stick" module. Conductors 11 and 12 can be allowed to protrude from the module to provide means for interconnecting the module with other circuitry. Obviously selected ones of conductors 11 and 12 could be clipped off either before or after encapsulation if this should be desired.

The "stick" module could be employed for many uses. For instance, it could be used as an adapter between strip type connectors on a cable. Also the "fishbone" could be wrapped around a large electrical component such as a transformer with the lead wires for both the larger component and associated smaller components being interconnected to conductors 11 and 12 which, when encapsulated, would provide a compact module with maximum utilization of space.

FIGURE 2 reveals another configuration that can be advantageously utilized in accordance with the present invention. The basic structure comprises a channel shaped member having a generally flat base strip 20 and two side strips 21 and 22. The entire channel is preferably fabricated by the extrusion of nylon but it is to be understood that base strip 20 could be either metallic or insulating material with side strips 21 and 22 bolted or bonded thereto.

Side strips 21 and 22 with sets of conductors shown generally at 23, 24, 25 and 26 are each somewhat similar to the fishbone assembly of FIGURE 1. It should be realized that the conductor retained by strips 21 and 22 could be single conductors extending completely therethrough or could protrude from only one side of either of these strips or any desired combination thereof.

Large electrical components can be easily mounted on base strip 20 on either side or both sides thereof with the leads being brought out and soldered or resistance welded to the conductors. Then the smaller components can be mounted between the conductors in any desired arrangement and the entire assembly encapsulated.

FIGURE 3 shows a typical module constructed in accordance with this invention with the encapsulating material partially broken away. In FIGURE 3, a flat base 30 is shown with two strips of insulating material 31 and 32 mounted to the sides thereof in a configuration somewhat similar to that shown in FIGURE 2. As can be seen in FIGURE 3, strips 31 and 32 are basically fishbone assemblies each having sets of substantially parallel conductors protruding from either side at 33, 35 and 36, a hidden set protruding from the lower side of strip 31.

Mounted on base strip 30 are a series of larger electrical components such as transformers, toroidal coils, potentiometers, electrolytic capacitors, slug-tuned coils, transistors and the like. In mounting transistors and other heat producing or heat sensitive elements, it will often be advantageous to fabricate base strip 30 from heat sink material to conduct heat away from these elements. Thus strip 30 could even be connected to a heat dissipator external to the module if this should be desired.

The leads from the larger components are brought out above and/or below strip 30 and connected to selected ones of the sets of conductors. The smaller electrical components associated with the module such as resistors and capacitors are then connected to the fishbone conductors to complete the desired circuit complex. Obviously the smaller components could be attached to the fishbone before the larger components are installed.

It can be seen from the configuration of FIGURE 3 that the connections on the fishbone conductors are easily accessible thus facilitating the arrangement of components for maximum space utilization as well as facilitating the reproducibility of the module for production. This also means, of course, that rearrangement of components during the engineering phase and the correcting of connection errors during the production phase are both easily accomplished. Furthermore, the exterior connecting feature is particularly conducive to resistance welding which is highly desirable when heat sensitive components are to be mounted. As is well-known, resistance welding greatly simplifies the lead forming problem and provides stronger and more reliable connections than by the soldering process. The simplified welding procedure realizable from this invention also reduces the welding tooling requirements, the fabrication time and the costs.

It is possible to fabricate a module similar to FIGURE 3 but omitting base strip 30. This could be accomplished by mounting strip 31 and 32 in a jig and then welding the components in place. The jig could then form part of the mold for encapsulating the module.

After the components have been emplaced, the entire assembly is encapsulated in a protective plastic material such as an epoxy resin or polyurethane foam which is then cured. One end of the module shown in FIGURE 3 is encased in encapsulant 37 with the ends of the fishbone connectors being allowed to protrude, a typical such protruding conductor being shown at 38. It is to be understood, of course, that the entire module in completed form would be encased in encapsulant 37. The fishbone conductors that do not serve to complete connections externally to the module could be clipped off either before or after encapsulation. The connections externally to the module can then be completed by any of a wide variety of well-known means. For instance, a printed circuit cable or board could be snapped onto the protruding pins or a cable connector or another module capable of receiving the pins could be used.

The module of FIGURE 3 includes several threaded sleeves embedded in the encapsulant such as is shown at 39. The purpose of these sleeves is to facilitate attachment of the completed module to other modules or to a chassis or any desired mounting arrangement. However, it should be pointed out that these sleeves can also serve as heat conductors to transmit the component heat to the chassis on which the module is mounted. In FIGURE 3, the module is shown attached to a plate 40 which could be part of a chassis, of course.

The module that is produced by this invention is a rigid structure that has a high degree of immunity to vibration and thus excellent reliability. In modules actually constructed, no heat dissipation problem was encountered. Thermocouple tests with a module electrically loaded and the external temperature varied from −35° F. to −160° F., with a 4 hour soak at each extreme, indicated an internal module temperature variation of only 10° F. The foregoing was the result of tests performed on a magnetic amplifier encapsulated in an epoxy resin known as Stycast 2982 which is a filled epoxy resin manufactured by Emerson and Cummings, Inc., of Canton, Massachusetts. Stycast 2982 was chosen because it has a low vibration amplification characteristic although it is to be understood that any suitable encapsulant could be used depending generally upon the anticipated environmental conditions. For instance, polyurethane foam at 10 pounds per cubic foot density exhibits excellent qualities as an encapsulant.

By use of the present invention, packaging densities of 75% or greater have been realized due to the ease of locating components in the complex. It has been found to be advantageous in some instances to encase glass components in a protective coating such as RTV20 silastic, a resilient silicon plastic made by G.E., to forestall damage due to temperature changes during the encapsulating process. A protective coating could also be used on transformers to reduce stress concentrations resulting from thermal expansion of the transformer. Such stress concentrations in some cases could result in cracking of the potting material.

Although the foregoing apparatus has been described with particularity, the present invention is not intended to be limited thereto. In fact, many variations of the steps and elements of this invention will be obvious to one having normal skill in the art without departing from the spirit of this invention. For instance, it is readily apparent that a single fishbone with a flat strip could be arranged in an L-shaped configuration similar to side strip 21, base strip 20 and a set of conductors such as 23 in FIGURE 2.

What we claim is:

1. An electrical circuit module comprising a flat insulating member having a generally rectangular shape, a first and second plurality of substantially parallel conductors mounted on and retained by said insulating member, said first and second pluralities of conductors extending from opposite longitudinal edges of said insulating member and being electrically isolated from each other, electrical components attached to said conductors providing interconnection therebetween, and insulating material encapsulating said member, said conductors and said components, at least one of said conductors extending beyond said insulating material to provide means for connecting to other electrical equipment, whereby an easily replaceable module substantially free from moisture and vibration is provided for an electrical system.

2. An apparatus for mounting and interconnecting electrical components comprising first, second and third insulating members each having a substantially rectangular shape, said first and second insulating members being attached to a respective longitudinal edge of said third insulating member forming a channel arrangement therewith, and first and second pluralities of conductors retained by each of said first and second insulating members respectively, said electrical components being attached to said conductors for interconnection therebetween.

3. An apparatus in accordance with claim 2 which includes insulating material encapsulating said insulating members, said conductors and said electrical components, predetermined conductors of said pluralities of conductors extending from said insulating material providing interconnection of said electrical components to other electrical circuitry, whereby an interchangeable electronic module is provided.

4. An electronic module comprising an elongated insulating member having raised sides forming a channel of generally U-shaped cross-section, first and second pluralities of substantially parallel conductors retained in electrical isolation from one another by one of said raised sides of said member, third and fourth pluralities of substantially parallel conductors retained by the other of said raised sides of said member, said conductors being positioned substantially perpendicular to the plane of the bottom of said channel, said first and second pluralities of conductors extending from opposite edges of said one of said raised sides and said third and fourth pluralities of conductors extending from opposite edges of said other of said raised sides, a plurality of electrical components attached to said conductors providing predetermined interconnections therebetween, and insulating material encapsulating said member, said conductors and said components, a predetermined number of said conductors having the end thereof extending from said insulating material for connecting to other electrical circuitry.

References Cited by the Examiner

UNITED STATES PATENTS

| | | | |
|---|---|---|---|
| 2,590,821 | 3/52 | Kiser | 317—101 |
| 2,777,192 | 1/57 | Albright | 29—155.5 |
| 2,855,580 | 10/58 | Tijs | 317—101 |
| 2,892,131 | 6/59 | MacDonnel | 317—101 |
| 2,902,628 | 9/59 | Leno | 317—101 |
| 2,962,801 | 12/60 | Cass | 29—155.5 |
| 3,013,187 | 12/61 | Wyma et al. | 317—101 |
| 3,039,177 | 6/62 | Burdett | 317—101 |

OTHER REFERENCES

IBM Bulletin, vol. 3, No. 2, July 1960, page 42.

JOHN F. BURNS, *Primary Examiner.*